United States Patent [19]

Takahashi

[11] 3,914,705

[45] Oct. 21, 1975

[54] CONTROL CIRCUIT WITH FIELD EFFECT TRANSISTORS OF A GAIN CONTROL AMPLIFIER

[75] Inventor: Susumu Takahashi, Tokyo, Japan

[73] Assignee: Sansui Electric Co., Ltd., Tokyo, Japan

[22] Filed: Aug. 23, 1974

[21] Appl. No.: 499,945

[30] Foreign Application Priority Data

Aug. 27, 1973 Japan ............................... 48-95903

[52] U.S. Cl. ............. 330/29; 179/1 GQ; 179/1 VL; 330/35

[51] Int. Cl.[2] ........................................... H03G 3/30

[58] Field of Search............ 330/29, 35, 38 M, 145; 325/319; 179/1 Vl, 1 G, 1 GQ

[56] References Cited

UNITED STATES PATENTS 3,229,218 1/1966 Sickles et al.................... 330/145 X 3,531,731 9/1970 Matsuura et al................. 330/29 X 3,825,684 7/1974 Ito et al........................... 179/1 GQ

*Primary Examiner*—James B. Mullins

*Attorney, Agent, or Firm*—Harris, Kern, Wallen & Tinsley

[57] ABSTRACT

A first one of plural field effect transistors formed in a semiconductor chip is used as a control field effect transistor operatively coupled to a gain control amplifier and acting as a variable resistance element for controlling the gain of the amplifier in response to a control voltage signal applied to the gate. The control voltage signal is varied in level relative to a reference voltage. The source of the first field effect transistor is connected to the source of a second one of the plural field effect transistors which is connected in the source follower arrangement. The gate of the second transistor is supplied with the reference voltage. In the control circuit of the invention the first control transistor is automatically permitted to have a suitable operating point by flowing a predetermined amount of source current through the second transistor.

7 Claims, 5 Drawing Figures

CONTROL CIRCUIT WITH FIELD EFFECT TRANSISTORS OF A GAIN CONTROL AMPLIFIER

This invention relates to a control circuit of gain control amplifiers, and more particularly to a control circuit of gain control amplifiers using field effect transistors as variable resistance elements.

A gain control amplifier is well known which uses a field effect transistor (which is hereinafter abbreviated to "FET") as a variable resistance element.

Even if, in case discrete field effect transistors are used, they are of the same type, their pinch-off voltage ($Vp$) or threshold voltage ($Vth$) will present a wide dispersion, so that the adjustment of the bias voltage is unavoidable for enabling the FET to have a suitable operating point. Accordingly, in an apparatus using in particular a plurality of gain control amplifiers the adjustment of a bias voltage impressed upon the FET's is extremely troublesome and time-consuming. As an example of such apparatus using a plurality of gain control amplifiers there is a matrix fourchannel decoder as disclosed in the U.S. Pat. No. 3,825,684 assigned to the same assignee as the present invention. This type of decoder is arranged to receive a first and a second composite signal produced by composing, for example, left-front, right-front, left-back and right-back directional audio input signals in preselected amplitude and phase relationships and to produce four output signals while varying the mixing coefficient or matrix coefficient of the first and second composite signals in accordance with the level relationship between the directional audio input signals contained in the first and second composite signals. In such decoder, one or two pairs of gain control amplifiers are used for the purpose of varying the matrix coefficient. This decoder is provided with one or two control voltage generators for generating two control voltage signals whose levels are varied in directions mutually opposite with respect to a reference voltage level in accordance with the level relationship between the directional audio input signals contained in the first and second composite signals. The gain of the gain control amplifiers is controlled by applying control voltage to the gates of the field effect transistors operatively coupled to the amplifiers.

Where the foregoing decoder apparatus is integrated, the integrated decoder apparatus will be comprised of a matrix integrated circuit and one or two control voltage generating integrated circuits.

There unavoidably exists a dispersion between levels of reference voltages generated by the control voltage generating integrated circuits so that account should also be taken of the dispersion of reference voltage levels to cause the control FET's to have a suitable operating point.

The present inventor considered whether it is possible to render the adjustment of the bias voltage of the FET's unnecessary by sorting the junction FET's or insulated gate FET's or MOS FET's with respect to pinch-off voltage ($Vp$) or threshold voltage ($Vth$). However, the pinch-off voltage ($Vp$) of the junction FET's presents a very wide dispersion so that the sorting of FET's is difficult. Investigation was made of the threshold voltage ($Vth$) of two hundred and twenty five MOS FET's, the result being that the average value of the $Vth$ (4.2 to 5.5 volts) is 4.85 volts and the standard deviation $\pm 3\rho$ ($\rho \approx 0.204$ volt) is approximately $\pm 12.6$ %. Accordingly, the MOS FET's remain smaller in standard deviation than the junction FET's. Nevertheless, it is difficult to render the bias voltage adjustment unnecessary also in the case of the MOS FET's. However, as a result of investigating a distribution of the threshold voltages ($Vth$) of plural MOS FET's formed in a semiconductor chip or array, the standard deviation $\pm 3\rho$ ($\rho \approx 0.0229$ volt) was approximately $\pm 1.8$ %, it being found out that the MOS FET's within the same array are substantially equal to each other in the threshold voltage ($Vth$). For non-adjustment of bias voltages of FET's, therefore, the use of FET's formed in a semiconductor chip is very advantageous. However, the FET arrays, even if they have the FET's of the same type formed therein, will also be different from one another in the average threshold voltage of MOS FET's. Therefore, the dispersion of the threshold voltage between the arrays has to be taken into consideration in order to render the bias voltage adjustment unnecessary.

Accordingly, the object of the invention is to provide a control circuit for a gain control amplifier capable of rendering adjustment of the bias voltage of FET's unnecessary independently from the dispersion or variation of the level of a reference voltage from the control voltage generator and that of the pinch-off voltage or threshold voltage of FET's between the control FET arrays.

According to the invention, one of plural FET's formed in one array, functioning as a compensating FET, is connected in a source-follower arrangement and set to a suitable operating point, and another one or more of the plural FET's are used as one or more control FET's operatively coupled to one or more gain control amplifiers, the source of the one or more control FET's being coupled to the source of the compensating FET. The gate of the compensating FET is impressed with a reference voltage from the control voltage generator while the gate of the one or more control FET's is supplied with a control voltage varied in level relative to the reference voltage.

The aforesaid compensating FET is so set as to have the suitable operating point, at which it has a suitable internal resistance, independently from its threshold voltage $Vth$ by an amount of source current determined by the source load resistance or current source. Since the sources of the control FET's are coupled in common to the source of the compensating FET, the same bias voltage as $V_{GS}$ between the source and gate of the compensating FET is provided across the source and gate of each control FET having substantially the same threshold voltage $Vth$ as that of the compensating FET. As the result, the suitable operation point or bias is automatically assured for each control FET. The control FET has the internal resistance varied in accordance with the control voltage with the operating point taken as a reference, thereby to control the gain of the gain control amplifier.

Since the operating point of the compensating FET is determined by an amount of current flowing between the source and drain thereof independently from the threshold voltage $Vth$, suitable operating points are assured for the control FET's within each array even when a dispersion or variation in the average value of $Vth$ occurs between the arrays. Further, since the operating point of the compensating FET is determined by the amount of source current in a manner free from the reference voltage applied to the gate thereof, the operating point of the control FET is not affected by the dispersion or variation of the reference voltage level from the control voltage generator.

This invention can be more fully understood from the following detailed description when taken in conjunction with the accompanying drawings, in which.

Figure 1:
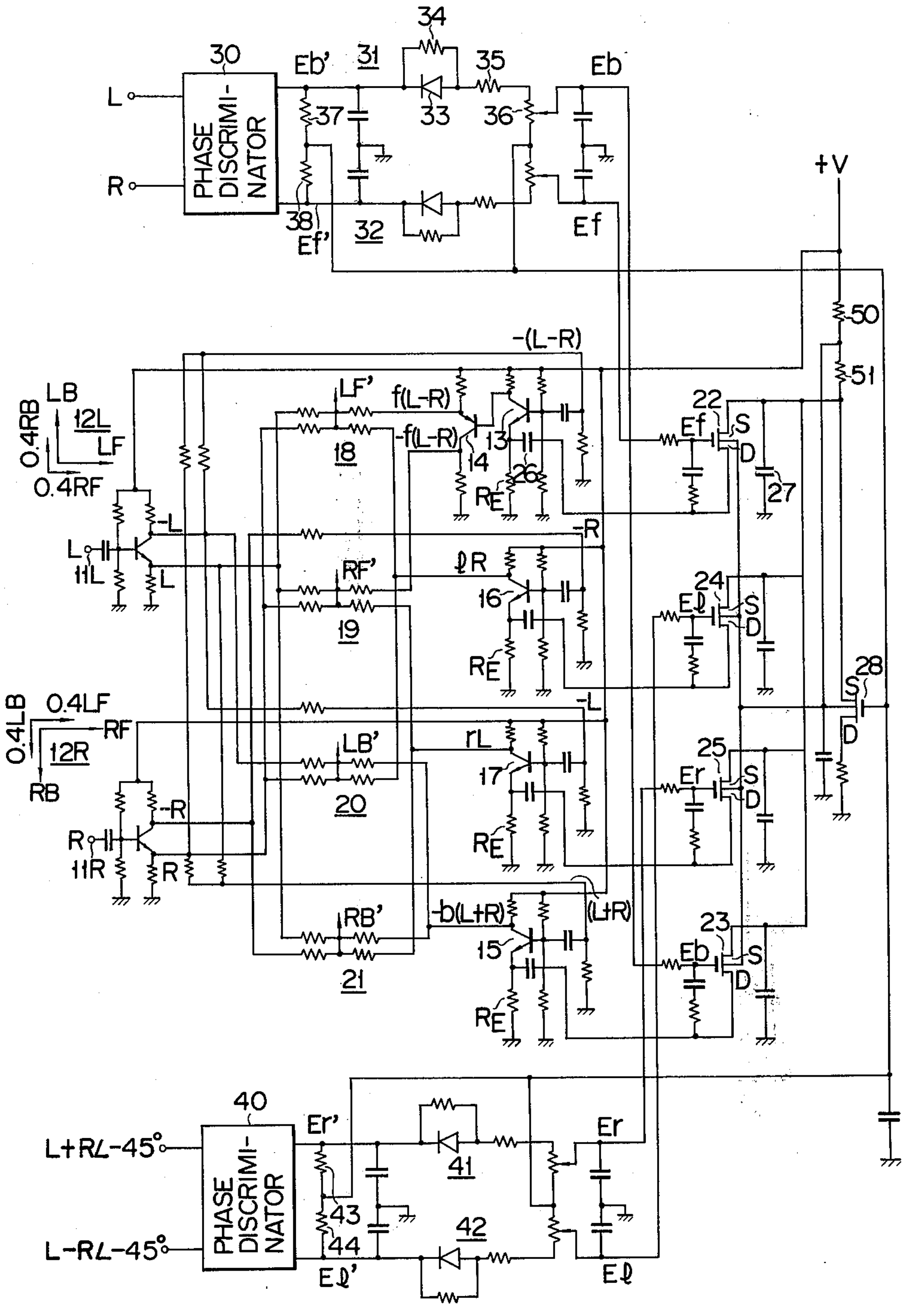
FIG. 1 is a circuit diagram of a matrix four-channel decoder using a control circuit according to the invention.

There will now be described the invention by way of an example of a matrix four-channel decoder.

To input terminals 11L and 11R of the decoder are applied first and second composite signals L and R as indicated by 12L and 12R which are produced by vectorially composing left-front (LF), left-back (LB), right-front (RF) and right-back (RB) directional audio input signals. A first gain control amplifier 13 amplifies a difference signal -(L-R) of the composite signals L and R to apply the amplified output to a phase splitter 14, thereby producing outputs $f$(L-R) and -f(L-R) where $f$ represents the gain coefficient of the amplifier 13. A second gain control amplifier 15 amplifies a sum signal (L+R) of the composite signals L and R to produce an output $-b$(L+R) where $b$ represents the gain coefficient of the amplifier 15. A third gain control amplifier 16 amplifies the inverted signal −R of the second composite signal R to produce an output signal $l$R where $l$ represents the gain coefficient of the amplifier 16. A fourth gain control amplifier 17 amplifies the inverted signal −L of the first composite signal L to produce an output signal $r$L where $r$ represents the gain coefficient of the amplifier 17.

A first matrix circuit 18 mixes signals L, R, $f$(L−R) and $l$R with each other in the ratio $(1+\sqrt{2}) : 1 : 1 : \sqrt{2}$ to produce a left-front output signal LF′. A second matrix circuit 19 mixes the signals R, L, $-f$(L−R) and $r$L with each other in the ratio $(1+\sqrt{2}) : 1 : 1 : \sqrt{2}$ to produce a right-front output signal RF′. A third matrix circuit 20 mixes the signals −L, R, $-b$(L+R) and $l$R in the ratio $(1+\sqrt{2}) : 1 : 1 : \sqrt{2}$ to produce a left-back output signal LB′. A fourth matrix circuit 21 mixes the signals −R, L, $-b$(L+R) and $r$L in the ratio $(1+\sqrt{2}): 1 : 1 : \sqrt{2}$ to produce a right-back output signal RB′.

Figure 2:
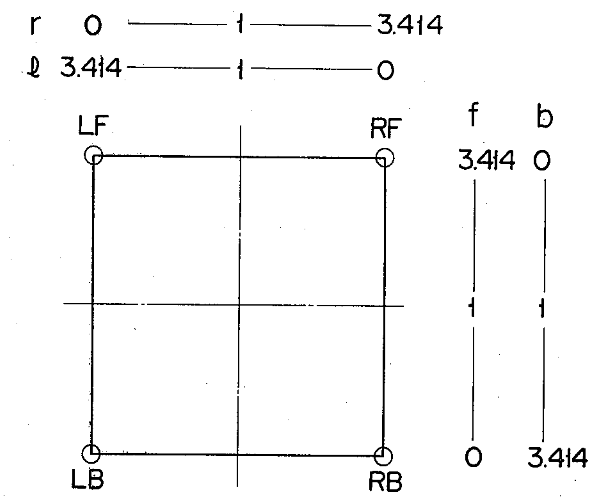
FIG. 2 shows the manner in which the matrix coefficient of the matrix four-channel decoder is varied.

Apparently, decoder outputs LF′, RF′, LB′ and RB′ will respectively be expressed by the equations:

$$LF' = k\{(1+\sqrt{2})\,L + R + f(L-R) + \sqrt{2}lR\}$$
$$RF' = k\{(1+\sqrt{2})\,R + L + f(R-L) + \sqrt{2}rL\}$$
$$LB' = -k\{(1+\sqrt{2})\,L - R + b(L+R) - \sqrt{2}lR\}$$
$$RB' = -k\{(1+\sqrt{2})\,R - L + b(R+L) - \sqrt{2}rL\}$$

where $k$ represents a proportionality factor. The gain or matrix coefficients $f$, $b$, $r$ and $l$ in the above equations are respectively varied as shown in FIG. 2. That is, $f$ and $b$ are varied, while bearing a mutually opposite relationship, up to 3.414 in the positive direction and up to 0 in the negative direction with the value 1 taken as a reference, the reference value 1 being obtained when the front and back audio input signals contained in the first and second compositie signals L and R are equal in level to each other. And $l$ and $r$ are similarly varied also with the value 1 taken as a reference, the reference value 1 being obtained when the left and right audio input signals contained in the first and second composite signals L and R are equal in level to each other. When no input signals are applied to the decoder, or when, as clear from the foregoing description, four input signals contained in the first and second composite signals L and R are identical to each other, $f$, $b$, $r$ and $l$ are respectively set to the reference value 1.

For the purpose of controlling the matrix coefficients $f$, $b$, $l$ and $r$, the respective source-drain paths of control MOS FET's 22, 23, 24 and 25 are coupled by capacitors 26 and 27 to the gain control amplifiers 13, 15, 16 and 17 in parallel relationship to emitter resistors $R_E$ or current sources. To the gates of the control FET's 22, 23, 24 and 25 are applied control voltages E$f$, E$b$, E$l$ and E$r$, respectively, from control voltage generators as later described.

Figure 3:
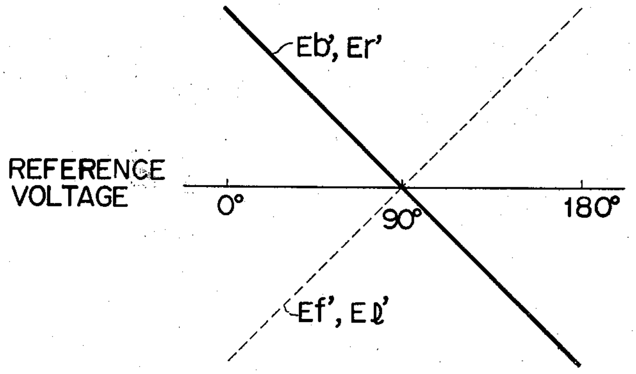
FIG. 3 shows the characteristic of the output voltages from the control voltage generators used in the decoder of FIG. 1.

For producing the control voltages E$f$ and E$b$ there is provided a first phase discriminator 30. The phase discriminator 30 produces the control voltages E$f'$ and E$b'$ whose variations in the positive and negative directions are symmetrical with respect to a reference voltage (for example, 16 volts) as shown in FIG. 3, in accordance with the phase relationship between the first and second composite signals L and R, namely, in accordance with the level relationship between the front and the back input signals contained in the first and second composite signals. The case where a phase difference of 0° takes place between the first and second composite signals L and R corresponds to the case where the front signals alone are contained in the composite signals L and R, the case where a phase difference of 180° takes place between the L and R corresponds to the case where the back signals alone are contained in the L and R, and the case where a phase difference of 90° takes place between the L and R corresponds to the case where the front and the back signals are equal in level to each other.

Figure 4:
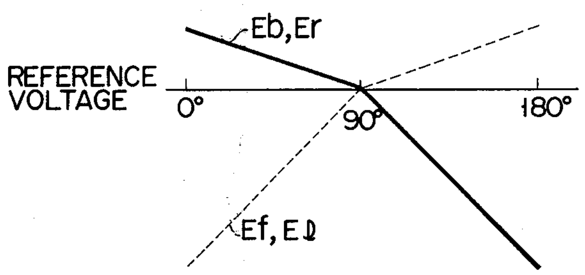
FIG. 4 shows the characteristic of the control voltage applied to the gate of FET's for controlling the gain of gain control amplifiers used in the decoder of FIG. 1.

For causing $f$ and $b$ to vary unsymmetrically with respect to the reference value 1 as shown in FIG. 2, the output voltages E$f'$ and E$b'$ of the phase discriminator 30 are converted by correction circuits 31 and 32 each consisting of a diode 33, resistors 34, 35 and a presetting potentiometer 36 into the control voltages E$f$ and E$b$, respectively, whose variations in the positive and negative directions are unsymmetrical with respect to the reference voltage level as shown in FIG. 4.

For producing the control voltages E$l$ and E$r$ there is provided a second phase discriminator 40. The phase discriminator 40 produces such output voltages E$l'$ and E$r'$ as shown in FIG. 3 in accordance with the phase relationship between a sum signal $L + R < -45°$ of the first and second composite signals L and R and a difference signal $L - R < -45°$, namely, in accordance with the level relationship between the left and the right input signals contained in the composite signals L and R. The output voltages E$l'$ and E$r'$ are converted by correction circuits 41 and 42 into the control voltages E$l$ and E$r$, respectively, whose variations in the positive and negative directions are unsymmetrical with respect to the reference voltage level as shown in FIG. 4.

A MOS FET 28 is connected to a power source in the source-follower arrangement. Where the FET's 22, 23, 24, 25 and 28 are of P-channel type, the source of FET 28 is connected to the supply voltage +V (for example, +25 volts) via load resistors 50 and 51 as shown. The FET's 22, 23, 24, 25 and 28 are formed in the same semiconductor chip or array, and the common substrate thereof is connected to the junction of the resistors 50 and 51. The sources of the control FET's 22 to 25 are connected in common to the source of the compensating FET 28. In this embodiment, the FET's may be of enhancement or depletion type. To the gate of the compensating FET 28 is applied an average voltage of the output voltages E*f*′ and E*b*′ of the first phase discriminator 30, namely, the reference voltage, which is derived from the junction of the resistors 37 and 38 equal in resistance value to each other and an average voltage of the output voltages E*l*′ and E*r*′ of the second phase discriminator 40, namely, the reference voltage, which is derived from the junction of the resistors 43 and 44 equal in resistance value to the resistors 37 and 38. That is, to the gate of the compensating FET 28 is applied the average voltage of the output voltages of the first and second phase discriminators 30 and 40.

It is required that when no input signal is applied to the decoder, the respective gains *f, b, l* and *r* of the gain control amplifiers 13, 15, 16 and 17 be respectively set to 1 as previously mentioned. For this reason, it is required that when the reference voltage is impressed upon the respective gates of the control FET's 22 to 25, the FET's 22 to 25 be so set as to have an operating point, that is, an internal resistance (for example, 2.3 kilo-ohms) permitting the respective gains of gain control amplifiers to be set to 1.

The source-drain conductance, accordingly the internal resistance of the compensating FET 28 is determined by a current the amount of which is determined by the source load resistors 50 and 51 or the current source independently from the threshold voltage V*th* of the FET 28. Accordingly, when the source current is so determined as to cause the FET 28 to have the resistance value of 2.3 kilo-ohms, the source-gate voltage $V_{SG}$ of the FET 28 becomes Vth + $\alpha$. The relationship of $V_S = V_G + Vth + \alpha$ is established between the gate voltage $V_G$ and the source voltage $V_S$. Since the control FET's 22 to 25 have substantially the same threshold voltage V*th* as that of the compensating FET 28 and their sources connected in common to that of the FET 28, the source-gate bias voltages $V_{SG}$ thereof respectively become V*th* + $\alpha$ as in the case of the FET 28, so that the FET's 22 to 25 respectively have the internal resistance of 2.3 kilo-ohms assured. More strictly, the FET 28 performs a DC operation and the FET's 22 to 25 respectively an AC operation, so that the source current of the FET 28 is so determined as to permit the FET's 22 to 25 to have the internal resistance of 2.3 kilo-ohms.

There will now be described the operation of the gain control amplifier in connection with, for example, the amplifier 13. When the control voltage E*f* increases up to a level higher by $\alpha$ than the reference voltage, the $V_{SG}$ of the FET 22 is made equal to V*th*, in which condition the internal resistance becomes infinite, resultantly to render the gain *f* of the amplifier 13 zero. When the control voltage E*f* decreases to a level lower than the reference voltage level, the internal resistance of the FET 22 is made smaller than 2.3 kilo-ohms to render the gain *f* of the amplifier 13 greater than 1. The variation latitudes of the gains of the amplifiers 13, 15, 16 and 17 are adjusted by the presetting potentiometers 36 so as to provide suitable separation characteristics.

Since, as aforesaid, the compensating FET 28 is so set as to have a suitable operating point, accordingly, internal resistance by the source current independently from the threshold voltage V*th* and the gate voltage, the control FET's 22 to 25 having substantially the same level of V*th* as that of the V*th* of the FET 28 can be so assured as to have the same operating point as in the case of the FET 28.

Accordingly, even if control FET's of another array which have a different value of Vth are used, they will be so assured as to have the suitable operating point if only the same amount of source current is flowed in the compensating FET. In the integrated decoder apparatus, a pair of phase discriminators capable of producing reference voltages equal in level to each other are selectively used. Accordingly, under such condition even if the reference voltage of one paired phase discriminators is different in level from the reference voltage of another paired discriminators, the control circuit according to the invention will not be affected thereby because the operating point of the compensating FET 28 is determined independently from the gate voltage, i.e., the reference voltage.

The preceding description referred to the case where the control circuit according to the invention is applied to the decoder apparatus comprising four gain control amplifiers and a pair of control voltage generators, but this invention is applicable also to a decoder comprising a pair of gain control amplifiers and a control voltage generator. With respect to the FET array, description was made of the P-channel MOS FET array, but an N-channel MOS FET array and a junction FET array are also available.

Figure 5:
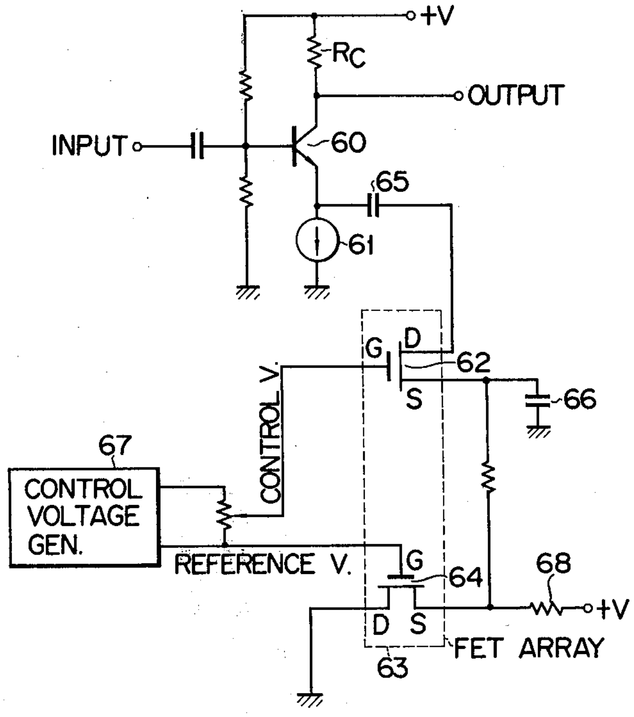
FIG. 5 is a circuit diagram in which the control circuit of the invention is applied to one gain control amplifier.

This invention is applicable also to one gain control amplifier. As shown in FIG. 5, the source-drain path of one P-channel FET 62 within an FET array 63 acting as a control FET is coupled by capacitors 65 and 66 to an emitter resistor of current source 61 of a gain control amplifying transistor 60 in parallel relationship thereto.

Another P-channel MOS FET 64 within the FET array 63 acting as a compensating FET is connected to a power source in the source-follower arrangement. The source of the control FET 62 is connected to the source of the compensating FET 64. The control FET 62 is assured to have a suitable operating point by flowing a predetermined amount of source current through the compensating FET 64 which is determined by a source load resistor 68. To the gate of the control FET 62 is applied a control voltage signal from a control voltage generator 67 whose level is varied relative to a reference voltage. Further, to the gate of the compensating FET 64 is applied the reference voltage. The reference voltage may be zero volt. In this case, the FET's should be of enhancement type. Where the gate of FET 64 is connected to the power source (+V), the FET's should be of depletion type. The gain of the gain control amplifier 60 is substantially given by a product of the resistance value of a collector resistor R*c* and the source-drain conductance *g* of the FET 62 since the current source 61 has a high internal resistance compared with the control FET 62. Where the reference voltage signal from the control voltage generator 67 is varied in level, the source voltage $V_S$ of the FET 64 is varied in level in accordance with the relationship of $V_S = V_G + Vth + \alpha$. Accordingly, the source voltage of the FET 62 is also varied in level. This variation, however, is offset between the soruce and gate of the FET 62, so that the source-gate voltage $V_{SG}$ is not affected by the variation of reference voltage. As a result, the control FET 62 has a suitable operating point assured regardless of the variation in the reference voltage level.

What is claimed is:

1. A gain control circuit for a gain control amplifier comprising a control field effect transistor having source, drain and gate and operatively coupled to the gain control amplifier to control the gain thereof in accordance with the resistance variation between the source and drain of said control field effect transistor; and control voltage generating means for generating a control voltage signal whose voltage level varies relative to a reference voltage, the gate of said control field effect transistor being connected to receive the control voltage signal, characterized in that said control field effect transistor consists of a first of a plurality of field effect transistors formed in a semiconductor chip, the source-drain path of said first field effect transistor being AC coupled to said gain control amplifier so that no DC current flows through the drain-source path of said first field effect transistor, and a second field effect transistor formed in said semiconductor chip is connected in source follower configuration to a power source so that a predetermined amount of DC current flows through the drain-source path of said second field effect transistor, the source of said second field effect transistor being DC coupled to the source of said first field effect transistor, and the gate of said second field effect transistor being coupled to the reference voltage.

2. A control circuit according to claim 1 wherein said first and second field effect transistors are each comprised of an insulated gate field effect transistor.

3. A gain control circuit for at least first and second gain control amplifiers and comprising first and second control field effect transistors each having source, drain andn gate and operatively coupled to said first and second gain control amplifiers, respectively, so as to control the gains thereof in accordance with the resistance variation between the source and drain of said first and second control field effect transistors, and control voltage signal generating means for generating first and second control voltage signals whose voltage levels vary in opposite directions with respect to a reference voltage, the gates of said first and second control field effect transistors being connected to receive said first and second control voltage signals, respectively, characterized in that said first and second control field effect transistors consist of first and second ones of at least three field effect transistors formed in a semiconductor chip, the source-drain paths of said first and second control field effect transistors being AC coupled to said first and second gain control amplifiers, respectively, so that no DC current flows through the drain-source path of each of said first and second control field effect transistors, and a third field effect transistor formed in said semiconductor chip is connected in source follower configuration to a power source so that a predetermined amount of DC current flows through the drain-source path of said third field effect transistor, the source of said third field effect transistor being DC coupled to the sources of said first and second field effect transistors and the gate of said third field effect transistor being coupled to the reference voltage.

4. A control circuit according to claim 3 wherein said field effect transistors are each comprised of an insulated gate field effect transistor.

5. A gain control circuit for at least one pair of first and second gain control amplifiers in a matrix four-channel decoder which is arranged to receive first and second composite signals containing a plurality of directional audio input signals in preselected amplitude and phase-shift relationships and to produce output signals by combining the first and second composite signals while varying the mixing coefficients of the first and second composite signals in accordance with the level relationship between the directional audio input signals, said gain control circuit comprising first and second control field effect transistors each having soruce, drain and gate and operatively coupled to said first and second gain control amplifiers, respectively, so as to control the gains thereof in accordance with the resistance variation betwen the source and drain of said first and second control field effect transistors, and control voltage generating means for generating at least first and second control voltage signals whose voltage levels vary in opposite directions with respect to a reference voltage in accordance with the level relationship between the directional audio input signals in said first and second composite signals, the gates of said first and second control field effect transistors being connected to receive said first and second control voltage signals, respectively, characterized in that said first and second control field effect transistors consist of first and second ones of at least three field effect transistors formed in a semiconductor chip, the source-drain paths of said first and second field effect transistors being AC coupled to said first and second gain control amplifiers, respectively, so that no DC current flows through the drain-source path of each of said first and second field effect transistors, and a third field effect transistor formed in said semiconductor chip is connected in source follower configuration to a power source so that a predetermined amount of DC current flows through the drain-source path of said third field effect transistor, the source of said third field effect transistor being DC coupled to the sources of said first and second field effect transistors, and the gate of said third field effect transistor being coupled to the reference voltage.

6. A control circuit according to claim 5 wherein said field effect transistors are each comprised of an insulated gate field effect transistor.

7. A gain control circuit for first, second, third and fourth gain control amplifiers in a matrix four-channel decoder which is arranged to receive first and second composite signals containing at least left-front, right-front, left-back and right-back directional audio input signals in preselected amplitude and phase relationships and to produce output signals by combining the first and second composite signals while varying the mixing coefficients of the first and second composite signals in accordance with the level relationship between the directional audio input signals, said gain control circuit comprising first, second, third and fourth field effect transistors each having source, drain and gate and operatively coupled to said first, second, third and fourth gain control amplifiers, respectively, so as to control the gains thereof in accordance with the resistance variation between the source and drain of said first, second, third, and fourth control field effect transistors, and control voltage generating means for generating first and second control voltage signals whose voltage levels vary in opposite directions with respect to a first reference voltage in accordance with the level relationship between front and back directional audio input signals in the first and second composite signals and for generating third and fourth control voltage signals whose voltage levels vary in opposite directions with respect to a second reference voltage in accordance with the level relationship between left and right directional audio input signals in the first and second composite signals, the gates of said first, second, third and fourth control field effect transistors being connected to receive said first, second, third and fourth control voltage signals, respectively, characterized in that said first, second, third and fourth control field effect transistors consist of first, second, third and fourth ones of at least five field effect transistors formed in a semiconductor chip, the source-drain paths of said first, second, third and fourth field effect transistors being AC coupled to said first, second, third and fourth gain control amplifiers, respectively, so that no DC current flows through the drain-source path of each of said first, second, third and fourth field effect transistors, and a fifth field effect transistor formed in said semiconductor chip is connected in source follower configuration to a power source so that a predetermined amount of DC current flows through the drain-source path of said fifth field effect transistor, the source of said fifth field effect transistor being DC coupled to the sources of said first, second, third and fourth field effect transistors and the gate of said fifth field effect transistor being coupled to an average voltage of said first and second reference voltages.

* * * * *